US012681104B2

(12) United States Patent
Takagi

(10) Patent No.: US 12,681,104 B2
(45) Date of Patent: Jul. 14, 2026

(54) SECONDARY BATTERY DEGRADATION DETERMINATION APPARATUS AND SECONDARY BATTERY DEGRADATION DETERMINATION METHOD

(71) Applicant: TOYOTA SYSTEMS CORPORATION, Nagoya (JP)

(72) Inventor: Atsushi Takagi, Toyota-city (JP)

(73) Assignee: Toyota Systems Corporation, Nagoya (JP)

( * ) Notice: Subject to any disclaimer, the term of this patent is extended or adjusted under 35 U.S.C. 154(b) by 658 days.

(21) Appl. No.: 17/966,927

(22) Filed: Oct. 17, 2022

(65) Prior Publication Data

US 2023/0400527 A1 Dec. 14, 2023

(30) Foreign Application Priority Data

Jun. 10, 2022 (JP) ................................. 2022-094305

(51) Int. Cl.
| | |
|---|---|
| *G01R 31/392* | (2019.01) |
| *G01R 31/36* | (2020.01) |
| *G01R 31/382* | (2019.01) |
| *H01M 10/48* | (2006.01) |

(52) U.S. Cl.
CPC ....... *G01R 31/392* (2019.01); *G01R 31/3648* (2013.01); *G01R 31/382* (2019.01); *H01M 10/486* (2013.01); *H01M 2220/20* (2013.01)

(58) Field of Classification Search
CPC .............. G01R 31/392; G01R 31/3648; G01R 31/382; G01R 31/367; B60L 58/16
See application file for complete search history.

(56) References Cited

U.S. PATENT DOCUMENTS

| | | | | |
|---|---|---|---|---|
| 11,385,295 | B2 * | 7/2022 | Dong ................... | G01R 31/367 |
| 2003/0193669 | A1 | 10/2003 | Takagi | |
| 2018/0299511 | A1 * | 10/2018 | Kim ..................... | G01R 31/367 |
| 2019/0170826 | A1 | 6/2019 | Shoa Hassani Lashidani | |
| 2020/0144830 | A1 * | 5/2020 | Muenzel ............... | H02J 7/0016 |
| 2020/0292624 | A1 | 9/2020 | Tajima et al. | |

(Continued)

FOREIGN PATENT DOCUMENTS

| | | |
|---|---|---|
| CN | 111201444 A | 5/2020 |
| CN | 112327192 A | 2/2021 |

(Continued)

OTHER PUBLICATIONS

Vanem Erik Etal, "Data-driven state of health modelling—A review of state of the art reflections on applications for maritime battery systems," Journal of Energy Storage, Elsevier BV, NL, vol. 43, Sep. 21, 2021 (Sep. 21, 2021).

*Primary Examiner* — Ricky Go
(74) *Attorney, Agent, or Firm* — OLIFF PLC

(57) ABSTRACT

A secondary battery degradation determination apparatus configured to perform degradation determination for a secondary battery as a determination target includes a processor. The processor is configured to calculate an estimated electric capacity of the secondary battery, based on at least a slope between any two points on a charging curve indicating a charging characteristic of the secondary battery; and perform the degradation determination for the secondary battery, based on the estimated electric capacity that is calculated.

12 Claims, 17 Drawing Sheets

(56) References Cited

U.S. PATENT DOCUMENTS

| | | | |
|---|---|---|---|
| 2022/0146590 A1 | 5/2022 | Asai et al. | |
| 2023/0014689 A1 | 1/2023 | Ogasawara et al. | |
| 2023/0305064 A1* | 9/2023 | Sharma | G01R 31/374 |
| 2023/0400527 A1 | 12/2023 | Takagi | |

FOREIGN PATENT DOCUMENTS

| | | |
|---|---|---|
| JP | H08-136629 A | 5/1996 |
| JP | 3941569 B2 | 7/2007 |
| JP | 2007-205877 A | 8/2007 |
| JP | 2011-75461 A | 4/2011 |
| JP | 2022-20404 A | 2/2022 |
| JP | 2023-180752 A | 12/2023 |
| KR | 10-1930646 B1 | 3/2019 |
| WO | 2021/020250 A1 | 2/2021 |
| WO | 2021/181536 A1 | 9/2021 |

* cited by examiner

FIG. 1
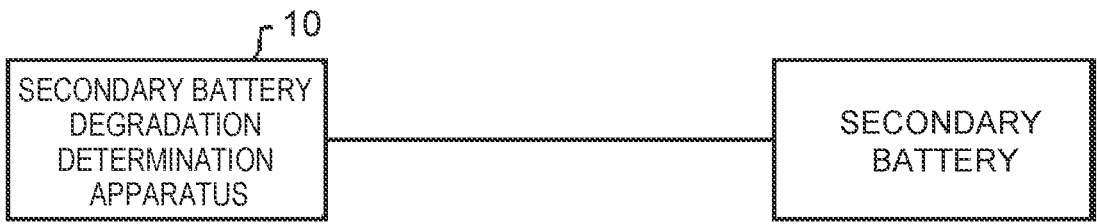
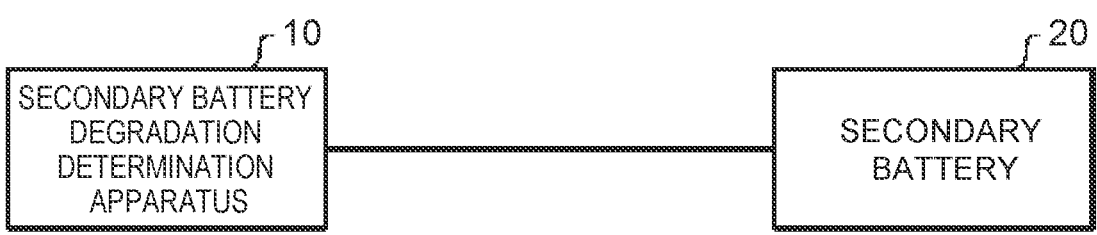

| MODEL | R | $R^2$ | ADJUSTED COEFFICIENT OF DETERMINATION $R^2$ | STANDARD DEVIATION OF ESTIMATED VALUE |
|---|---|---|---|---|
| 1 | 0.920 | 0.847 | 0.845 | 0.449 |

FIG. 6

| MODEL | | UNSTANDARDIZED COEFFICIENT | | STANDARDIZED COEFFICIENT BETA | t-VALUE | SIGNIFICANCE PROBABILITY |
|---|---|---|---|---|---|---|
| | | B | STANDARD ERROR | | | |
| 1 | CONSTANT VALUE | 22.226 | 5.616 | — | 3.957 | 0.000 |
| | T | -0.077 | 0.006 | -0.757 | -13.481 | 0.000 |
| | $V_0$ | -1.525 | 0.694 | -0.067 | -2.197 | 0.029 |
| | CD | -639354.99 | 146437.18 | -0.376 | -4.366 | 0.000 |
| | EF | -3035009.82 | 169843.687 | -0.942 | -17.869 | 0.000 |

FIG. 10

| EXPLANATORY VARIABLE | DETAILS |
|---|---|
| $V_0$ | INITIAL VOLTAGE VALUE AT TIME OF START OF CHARGE |
| CD | SLOPE BETWEEN POINT C (0.31 SECONDS AFTER START OF CHARGE) AND POINT D (10 SECONDS AFTER POINT C) |
| $V_C$ | VOLTAGE VALUE AT POINT C |
| EF | SLOPE BETWEEN POINT E (290 SECONDS AFTER START OF CHARGE) AND POINT F (10 SECONDS AFTER POINT E) |
| $V_E$ | VOLTAGE VALUE AT POINT E |
| HI | SLOPE BETWEEN POINT H (0.01 SECONDS AFTER START OF DISCHARGE) AND POINT I (10 SECONDS AFTER POINT H) |
| $V_H$ | VOLTAGE VALUE AT POINT H |
| JK | SLOPE BETWEEN POINT J (10 SECONDS AFTER START OF DISCHARGE) AND POINT K (20 SECONDS AFTER POINT J) |
| $V_J$ | VOLTAGE VALUE AT POINT J |

FIG. 12

| EXPLANATORY VARIABLE | DETAILS |
|---|---|
| $V_0$ | INITIAL VOLTAGE VALUE AT TIME OF START OF CHARGE |
| $V_B$ | VOLTAGE VALUE AT POINT B THAT IS END POINT OF VERTICAL RISING OF VOLTAGE STARTING FROM START OF CHARGE |
| $V_C$ | VOLTAGE VALUE AT POINT C THAT IS TWO SECONDS AFTER START OF CHARGE |
| $V_E$ | VOLTAGE VALUE AT POINT E THAT IS 270 SECONDS AFTER START OF CHARGE |
| C' | FIRST DERIVATIVE AT POINT C |
| E' | FIRST DERIVATIVE AT POINT E |
| H' | FIRST DERIVATIVE AT POINT H (26 SECONDS AFTER START OF DISCHARGE) |
| J' | FIRST DERIVATIVE AT POINT J (50 SECONDS AFTER START OF DISCHARGE) |
| L" | SECOND DERIVATIVE AT POINT L (20 SECONDS AFTER START OF CHARGE) |
| N" | SECOND DERIVATIVE AT POINT N (26 SECONDS AFTER START OF CHARGE) |

FIG. 15

SECONDARY BATTERY DEGRADATION DETERMINATION APPARATUS AND SECONDARY BATTERY DEGRADATION DETERMINATION METHOD

CROSS-REFERENCE TO RELATED APPLICATION

This application claims priority to Japanese Patent Application No. 2022-094305 filed on Jun. 10, 2022, incorporated herein by reference in its entirety.

BACKGROUND

1. Technical Field

The disclosure relates to a secondary battery degradation determination apparatus and a secondary battery degradation determination method that can perform degradation determination for a secondary battery quickly and efficiently.

2. Description of Related Art

With rapid electrification of vehicles in these days, there is rising demand for secondary batteries for vehicles, and with such circumstances, there is also increasing need for reuse of secondary batteries. When a vehicle is retired, a secondary battery is extracted from the vehicle and sent to a recycling company, and the recycling company performs degradation determination for the secondary battery. When it is determined that the secondary battery is reusable as a result of the degradation determination, the secondary battery is rebuilt and used on a secondhand market.

Therefore, there has been a technique for performing such battery degradation determination for a secondary battery. For example, Japanese Unexamined Patent Application Publication No. 2022-020404 discloses a technique in which a side-reaction current in a negative electrode of a secondary battery during a travel period is measured based on a value obtained by subtracting an amount of electricity used during the travel period and a remaining capacity after the travel period from a previous full-charge capacity; a coating amount is estimated based on the side-reaction current in the negative electrode; and a state of degradation of the secondary battery is determined based on the coating amount.

SUMMARY

However, the technique according to JP 2022-020404 A is configured to perform degradation determination at a charger, needs to acquire an amount of electricity used during a travel period and a remaining capacity after the travel period, and is therefore unable to be used when a recycling company performs degradation determination for a secondary battery. Accordingly, the recycling company has no choice but to fully charge and then discharge a secondary battery to acquire charging and discharging characteristics, and then perform degradation determination based on the charging and discharging characteristics, and a large amount of time is required to acquire such charging and discharging characteristics.

The disclosure provides a secondary battery degradation determination apparatus and a secondary battery degradation determination method that can perform degradation determination for a secondary battery quickly and efficiently.

A first aspect of the disclosure relates to a secondary battery degradation determination apparatus configured to perform degradation determination for a secondary battery as a determination target. The secondary battery degradation determination apparatus includes a processor. The processor is configured to calculate an estimated electric capacity of the secondary battery, based on at least a slope between any two points on a charging curve indicating a charging characteristic of the secondary battery; and perform the degradation determination for the secondary battery, based on the estimated electric capacity that is calculated.

In the aspect, the processor may be configured to calculate the estimated electric capacity of the secondary battery by using a multiple regression model in which the estimated electric capacity is a response variable, and explanatory variables include a voltage value slope between the two points on the charging curve of the secondary battery.

In the aspect, the processor may be configured to calculate the estimated electric capacity of the secondary battery by using the multiple regression model in which the explanatory variables include at least one of a voltage value at a time of starting charging of the secondary battery and a temperature at a time of measuring the charging curve, in addition to the voltage value slope between the two points on the charging curve.

In the aspect, the processor may be configured to calculate a coefficient of the multiple regression model, based on charging curves and electric capacities of a plurality of secondary batteries, and calculate the estimated electric capacity of the secondary battery by using the multiple regression model to which the calculated coefficient is applied.

In the aspect, the processor may be configured to calculate the estimated electric capacity of the secondary battery by using a multiple regression model in which the estimated electric capacity is a response variable, and explanatory variables include at least one of a voltage value slope between any two points on a discharging curve of the secondary battery and any voltage value on the discharging curve.

In the aspect, the processor may be configured to calculate the estimated electric capacity of the secondary battery by using a trained model that is generated by causing a predetermined multilayer neural network to perform supervised learning by using, as teaching data, charging and discharging curves indicating charging and discharging characteristics of a plurality of secondary batteries, and electric capacities of the plurality of secondary batteries as correct data.

In the aspect, the processor may be configured to calculate the estimated electric capacity of the secondary battery by using a trained model that is generated through machine learning using gradient boosting of a decision tree.

In the aspect, the processor may be configured to determine that the secondary battery is good and reusable when the estimated electric capacity is equal to or more than a predetermined threshold value, and to determine that the secondary battery is defective and unfit for reuse when the estimated electric capacity is less than the predetermined threshold value.

A second aspect of the disclosure relates to a secondary battery degradation determination apparatus configured to perform degradation determination for a secondary battery as a determination target. The secondary battery degradation determination apparatus includes a processor. The processor is configured to calculate an estimated electric capacity of the secondary battery, based on at least a voltage value at a predetermined point on a charging curve indicating a charging characteristic of the secondary battery; and perform the degradation determination for the secondary battery, based on the estimated electric capacity that is calculated.

A third aspect of the disclosure relates to a secondary battery degradation determination apparatus configured to perform degradation determination for a secondary battery as a determination target. The secondary battery degradation determination apparatus includes a processor. The processor is configured to calculate an estimated electric capacity of the secondary battery, based on at least a first derivative of a voltage value and a second derivative of a voltage value at predetermined points on a charging and discharging curve, or one of the first derivative and the second derivative, the charging and discharging curve indicating charging and discharging characteristics of the secondary battery; and perform the degradation determination for the secondary battery, based on the estimated electric capacity that is calculated.

A fourth aspect of the disclosure relates to a secondary battery degradation determination method for a secondary battery degradation determination apparatus configured to perform degradation determination for a secondary battery as a determination target. The secondary battery degradation determination method includes calculating an estimated electric capacity of the secondary battery, based on at least a slope between any two points on a charging curve indicating a charging characteristic of the secondary battery; and performing the degradation determination for the secondary battery, based on the estimated electric capacity that is calculated.

A fifth aspect of the disclosure relates to a secondary battery degradation determination method for a secondary battery degradation determination apparatus configured to perform degradation determination for a secondary battery as a determination target. The secondary battery degradation determination method includes calculating an estimated electric capacity of the secondary battery, based on at least a voltage value at a predetermined point on a charging curve indicating a charging characteristic of the secondary battery; and performing the degradation determination for the secondary battery, based on the estimated electric capacity that is calculated.

A sixth aspect of the disclosure relates to a secondary battery degradation determination method for a secondary battery degradation determination apparatus configured to perform degradation determination for a secondary battery as a determination target. The secondary battery degradation determination method includes calculating an estimated electric capacity of the secondary battery, based on at least a first derivative of a voltage value and a second derivative of a voltage value at predetermined points on a charging and discharging curve, or one of the first derivative and the second derivative, the charging and discharging curve indicating charging and discharging characteristics of the secondary battery; and perform the degradation determination for the secondary battery, based on the estimated electric capacity that is calculated.

According to the aspects of the disclosure, degradation determination can be performed for a secondary battery quickly and efficiently.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 1 is an explanatory diagram for describing an outline of a secondary battery degradation determination system according to a first embodiment;

FIG. 2 shows a system configuration of the secondary battery degradation determination system according to the first embodiment;

FIG. 5 shows an example of a summary of a model resulting from a multiple regression analysis;

FIG. 6 shows an example of coefficients of the multiple regression analysis;

FIG. 10 shows an example of explanatory variables of a multiple regression model in a modification 1;

FIG. 12 shows an example of explanatory variables of a multiple regression model in a modification 2;

FIG. 15 shows a system configuration of a secondary battery degradation determination system according to a second embodiment;

DETAILED DESCRIPTION OF EMBODIMENTS

Figure 3:
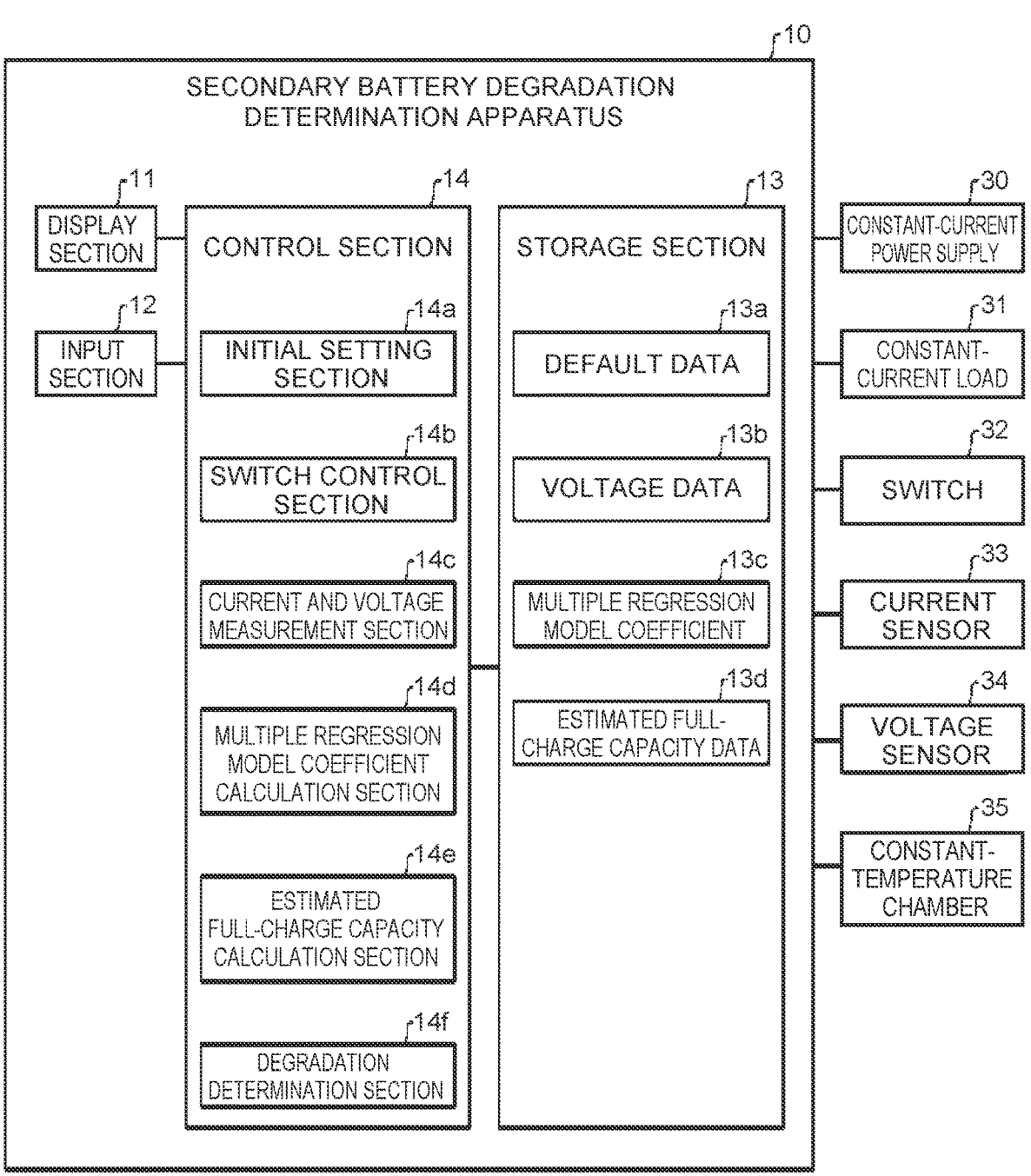
FIG. 3 is a functional block diagram for describing a configuration of a secondary battery degradation determination apparatus shown in FIG. 2.

Hereinafter, a secondary battery degradation determination apparatus and a secondary battery degradation determination method according to embodiments of the disclosure are described in detail based on the drawings. Here, the description is focused on a case where degradation determination is performed for a secondary battery for a vehicle that is mounted on an electrified vehicle or a hybrid electric vehicle. However, the disclosure is not limited to a secondary battery for a vehicle, and can be applied to cases where various recycled secondary batteries are reused.

First Embodiment

Outline of Secondary Battery Degradation Determination System

First, an outline of a secondary battery degradation determination system according to a first embodiment is described. FIG. 1 is an explanatory diagram for describing the outline of the secondary battery degradation determination system according to the first embodiment. The secondary battery degradation determination system according to the first embodiment is a system that performs degradation determination for a secondary battery 20 (to determine whether the secondary battery 20 has degraded), based on an estimated full-charge capacity Q of the secondary battery 20.

Conventionally, when a vehicle is retired, a secondary battery is extracted from the vehicle and sent to a recycling company, where a simple examination is performed, and then the secondary battery is sent to a rebuilding company. At the rebuilding company, degradation determination is performed for the secondary battery. Then, when it is determined that the secondary battery is reusable as a result of the degradation determination, the secondary battery is rebuilt and used on a secondhand market. Accordingly, it is necessary to quickly and efficiently perform the degradation determination for a secondary battery.

Therefore, in the secondary battery degradation determination system according to the first embodiment, a multiple regression model is constructed beforehand in which a full-charge capacity $Q_0$ of a secondary battery is a response variable (i.e., an objective variable), and a charging curve of the secondary battery (including a battery temperature at a time of measuring the secondary battery) is used for an explanatory variable. A plurality of secondary batteries prepared beforehand are connected to a secondary battery degradation determination apparatus 10 as shown in an upper diagram of FIG. 1, a charging curve and a full-charge capacity $Q_0$ of each secondary battery are measured, and coefficients of the multiple regression model are calculated by using the measured charging curves and full-charge capacities $Q_0$. Such a charging curve represents data on voltage values of a secondary battery at a plurality of predetermined time points.

When degradation determination is performed for a secondary battery 20 to be evaluated, the secondary battery 20 is connected to the secondary battery degradation determination apparatus 10 as shown in a lower diagram of FIG. 1, a charging curve of the secondary battery 20 is measured, and a full-charge capacity estimated by using the measured charging curve and the multiple regression model (which is hereinafter referred to as "estimated full-charge capacity Q") is calculated. Then, degradation determination is performed for the secondary battery 20, based on the estimated full-charge capacity Q.

Specifically, when the estimated full-charge capacity Q is equal to or more than a predetermined threshold value, it is determined that the secondary battery 20 is good and reusable, and when the estimated full-charge capacity Q is less than the predetermined threshold value, it is determined that the secondary battery 20 is defective and unfit for reuse.

Here, the charging curve is a curve plotted for voltage values with respect to time t, the voltage values corresponding to voltages at both terminals of the secondary battery 20 obtained when a constant direct current is applied to the secondary battery 20 by using a stabilized power supply. The charging curve is measured by connecting a plus terminal and a minus terminal of the constant-current power supply to a plus terminal and a minus terminal of the secondary battery, respectively. A discharging curve is a curve plotted for voltage values with respect to time t, the voltage values corresponding to voltages at both terminals of the secondary battery 20 obtained when a constant direct current is caused to flow out of the secondary battery 20 by using a constant-current load. Examples of the discharging curve include a discharging curve plotted when discharge is performed without a load by opening a plus terminal and a minus terminal of the secondary battery without using a constant-current load.

Moreover, here, multiple regression analysis is performed by using voltage changes on a charging and discharging curve, for a parameter. The reason is as follows. Equivalent circuit constants of an equivalent circuit including a capacitive element and a resistive element can be calculated from charging and discharging characteristics, and the equivalent circuit constants can also be used as explanatory variables. However, complicated calculation is required to perform multiple regression analysis using the equivalent circuit constants, which change over time, as explanatory variables. Accordingly, with attention drawn to the fact that changes over time in the equivalent circuit constants appear on a charging and discharging curve indicating the charging and discharging characteristics, multiple regression analysis is performed by using voltage changes on the charging and discharging curve, for a parameter.

System Configuration of Secondary Battery Degradation Determination System

Figure 2:
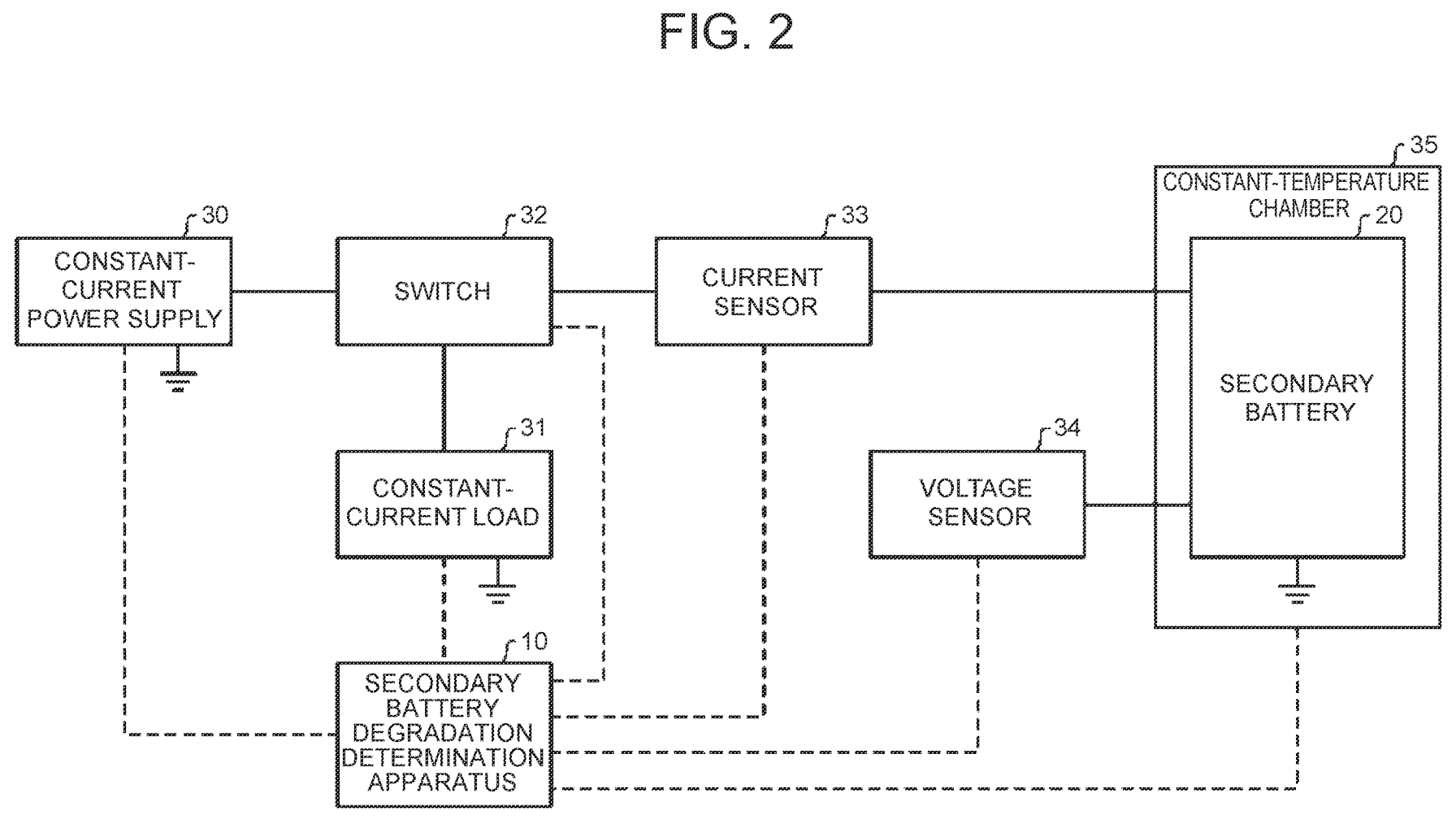

Next, a system configuration of the secondary battery degradation determination system according to the first embodiment is described. FIG. 2 shows the system configuration of the secondary battery degradation determination system according to the first embodiment. Here, it is assumed that the coefficients of the multiple regression model are calculated beforehand.

As shown in FIG. 2, the secondary battery degradation determination system according to the first embodiment includes the secondary battery degradation determination apparatus 10, a constant-current power supply 30, a constant-current load 31, a switch 32, a current sensor 33, a voltage sensor 34, and a constant-temperature chamber 35. A solid line shown in the drawing represents a connection line that connects circuit elements, and a broken line shown in the drawing represents a control line.

The secondary battery 20 is a battery that can be used repeatedly by repeating charge and discharge, and is, for example, a nickel metal hydride battery or the like. The constant-current power supply 30 is a power supply that applies a constant current when the secondary battery 20 is charged. The constant-current load 31 is a load apparatus that performs discharge by allowing a constant current to flow when the secondary battery 20 is discharged.

The switch 32 is a switch that changes a connection state so as to connect the constant-current power supply 30 to the secondary battery 20 when the secondary battery 20 is charged, and to connect the constant-current load 31 to the secondary battery 20 when the secondary battery 20 is discharged.

The current sensor 33 is a sensor that measures a current flowing into the secondary battery 20 from the constant-current power supply 30, and a current flowing out of the secondary battery 20 to the constant-current load 31. The voltage sensor 34 is a voltage sensor that measures a voltage value of the secondary battery 20. The constant-temperature chamber 35 is an apparatus that keeps the secondary battery 20 at a constant temperature.

Here, the secondary battery degradation determination apparatus 10 shown in FIG. 2 initializes settings by powering on each of the constant-current power supply 30, the constant-current load 31, and the constant-temperature chamber 35. The secondary battery degradation determination apparatus 10 controls the switch 32 such that the constant-current power supply 30 is connected to the secondary battery 20, and then the secondary battery 20 is charged.

The secondary battery degradation determination apparatus 10 measures the voltage value during charge of the secondary battery 20, by using the voltage sensor 34. At the time, the secondary battery degradation determination apparatus 10 measures the current value during the charge of the secondary battery 20, by using the current sensor 33, and performs current control such that the current value is a predetermined value. Thereafter, the secondary battery degradation determination apparatus 10 controls the switch 32 such that the secondary battery 20 is connected to the constant-current load 31, to cause electric charge accumulated in the secondary battery 20 to be discharged.

Thereafter, the secondary battery degradation determination apparatus 10 calculates an estimated full-charge capacity Q by using the multiple regression model, based on a charging curve of the secondary battery 20. Thereafter, the secondary battery degradation determination apparatus 10 performs degradation determination for the secondary battery 20, based on the estimated full-charge capacity Q of the secondary battery 20.

Configuration of Secondary Battery Degradation Determination Apparatus 10

Next, a configuration of the secondary battery degradation determination apparatus 10 is described. FIG. 3 is a functional block diagram for describing the configuration of the secondary battery degradation determination apparatus 10 shown in FIG. 2. As shown in FIG. 3, the secondary battery degradation determination apparatus 10 includes a display section 11, an input section 12, a storage section 13, and a control section 14. Moreover, the constant-current power supply 30, the constant-current load 31, the switch 32, the current sensor 33, the voltage sensor 34, and the constant-temperature chamber 35 are connected to the secondary battery degradation determination apparatus 10.

The display section 11 includes a display device such as a liquid crystal panel or a display unit, and the input section 12 includes an input device such as a numeric keypad or a mouse. Note that the display section 11 and the input section 12 can also be collectively configured as a display and operation section.

The storage section 13 includes a storage device such as a hard disk device or a non-volatile memory, and stores default data 13a, voltage data 13b, multiple regression model coefficient 13c, and estimated full-charge capacity data 13d. The default data 13a includes initial values for the constant-current power supply 30, the constant-current load 31, the constant-temperature chamber 35, and the like. The voltage data 13b is data on voltage values of the secondary battery 20 measured by the voltage sensor 34.

The multiple regression model coefficient 13c includes coefficients calculated by performing multiple regression analysis, based on a plurality of charging curves and full-charge capacities $Q_0$. In the multiple regression analysis, a charging curve is used for explanatory variables. The estimated full-charge capacity data 13d is data on an estimated full-charge capacity Q of the secondary battery 20 evaluated.

The control section 14 is a control section that controls the entire secondary battery degradation determination apparatus 10, and includes an initial setting section 14a, a switch control section 14b, a current and voltage measurement section 14c, a multiple regression model coefficient calculation section 14d, an estimated full-charge capacity calculation section 14e, and a degradation determination section 14f. In actuality, a central processing unit (CPU) is caused to perform respective processes corresponding to the initial setting section 14a, the switch control section 14b, the current and voltage measurement section 14c, the multiple regression model coefficient calculation section 14d, the estimated full-charge capacity calculation section 14e, and the degradation determination section 14f, by loading respective programs thereof into the CPU and causing the CPU to execute the respective programs. In other words, the control section 14 includes a processor. That is to say, the secondary battery degradation determination apparatus 10 includes the processor.

The initial setting section 14a is a setting section that performs processing of setting initial values on the constant-current power supply 30, the constant-current load 31, and the like. For example, the current value of current output from the constant-current power supply 30 is set at one ampere (1 A).

The switch control section 14b is a control section that performs switch control for connecting the secondary battery 20 to the constant-current power supply 30, and switch control for connecting the secondary battery 20 to the constant-current load 31. To control the switch, switch control is performed according to a predetermined charging time period and a predetermined discharging time period.

The current and voltage measurement section 14c causes the current sensor 33 to measure a value of current flowing into the secondary battery 20 when the secondary battery 20 is charged, and causes the current sensor 33 to measure a value of current flowing out of the secondary battery 20 when the secondary battery 20 is discharged. Moreover, the current and voltage measurement section 14c performs processing of causing the voltage sensor 34 to measure a voltage value of the secondary battery 20, and storing the measured voltage value as the voltage data 13b in the storage section 13.

The multiple regression model coefficient calculation section 14d is a processing section that calculates the coefficients of the multiple regression model, based on charging curves and full-charge capacities $Q_0$ of a plurality of secondary batteries that are measured beforehand. The estimated full-charge capacity calculation section 14e is a processing section that calculates an estimated full-charge capacity Q by using the multiple regression model.

The degradation determination section 14f is a processing section that determines, based on the estimated full-charge capacity Q calculated by the estimated full-charge capacity calculation section 14e, whether or not the secondary battery 20 is good and reusable. Specifically, when the estimated full-charge capacity Q of the secondary battery 20 is equal to or more than a predetermined threshold value, it is determined that the secondary battery 20 is good and reusable, and when the estimated full-charge capacity Q is less than the predetermined threshold value, it is determined that the secondary battery 20 is defective and unfit for reuse.

The constant-current power supply 30 is a power supply that applies a constant current set by the initial setting section 14a to the secondary battery 20. The constant-current load 31 is a load that causes a constant current set by the initial setting section 14a to flow from the secondary battery 20. The switch 32 switches between connecting the constant-current power supply 30 to the secondary battery 20 and connecting the constant-current load 31 to the secondary battery 20, at a predetermined time point.

The current sensor 33 is connected to the switch 32 and the secondary battery 20 in series, and is a sensor that measures a value of current flowing into the secondary battery 20 when the secondary battery 20 is charged, and that measures a value of current flowing out of the secondary battery 20 when the secondary battery 20 is discharged. The voltage sensor 34 is a sensor that measures a voltage value of the secondary battery 20. The constant-temperature chamber 35 is a chamber that keeps an atmosphere temperature Ta around the secondary battery 20 constant when a charging curve of the secondary battery 20 is measured.

Calculation of Multiple Regression Model Coefficients

Figure 4:
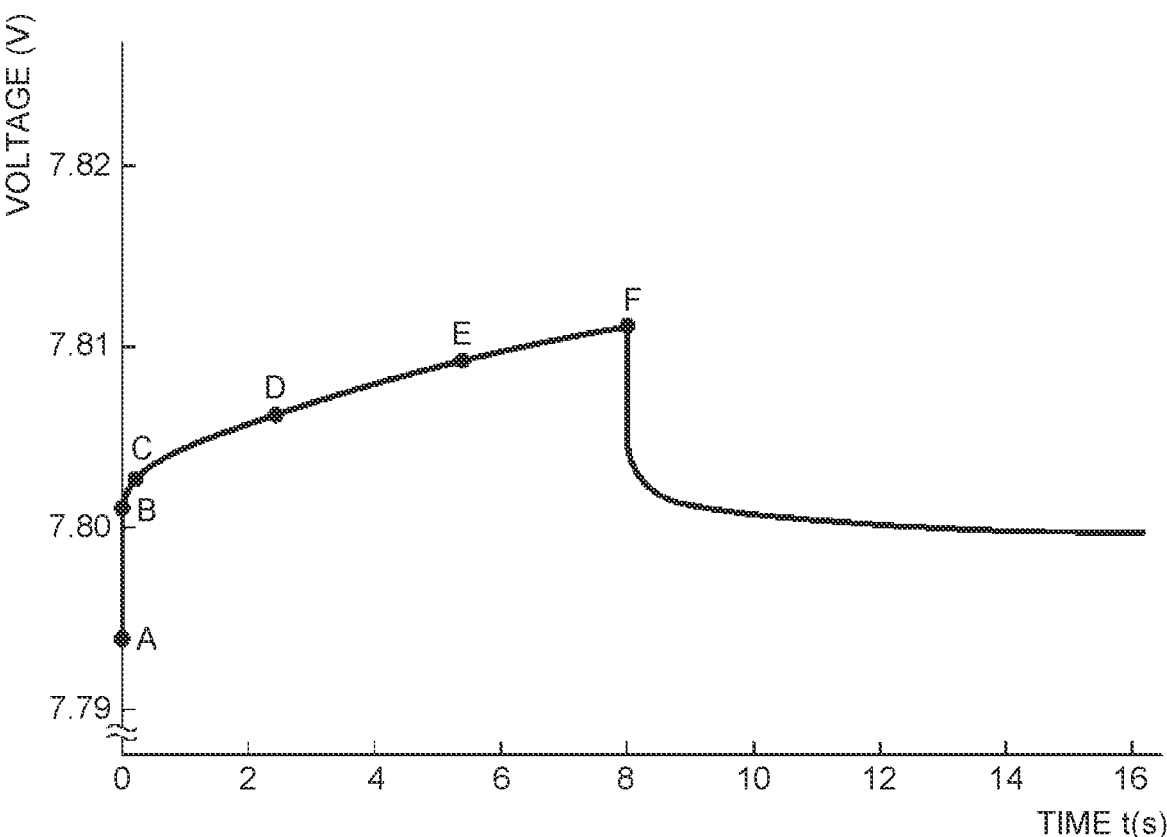
FIG. 4 is an explanatory diagram for describing an example of measurement points on a charging curve.

Next, calculation of the coefficients of the multiple regression model is described. Here, parameters based on a charging curve of a secondary battery are a battery temperature Tb, an initial voltage value $V_0$, and a voltage value slope between any two points on the charging curve, and the coefficients of the multiple regression model are calculated, with the parameters serving as explanatory variables, and a full-charge capacity $Q_0$ of the secondary battery serving as a response variable. FIG. 4 is an explanatory diagram for describing an example of measurement points on a charging curve.

As shown in FIG. 4, six points from point A to point F are set on a charging curve. Point A is a point of start of charge, and point B is an end point of the vertical rising of the voltage starting from the start of charge. Assuming that time corresponding to point A is t=0, point C is a first predetermined time period of $t_1$ seconds after point A. The first predetermined time period of $t_1$ seconds is, for example, 300 milliseconds.

Point D is a second predetermined time period of $t_2$ seconds after point C. The second predetermined time period of $t_2$ seconds is, for example, three seconds. Point E is the second predetermined time period of $t_2$ seconds before point F that is a point of end of charge (a point of start of discharge). Here, the charging time period is eight seconds. When multiple regression analysis is performed, a voltage value slope on the charging curve of the secondary battery is calculated here, although voltage values at points A to F can also be used for explanatory variables.

For example, a voltage value slope CD for a time period between point C and point D can be calculated as $CD=(V_D-V_C)/(t_D-t_C)$. A voltage value slope EF for a time period between point E and point F can be calculated as $EF=(V_F-V_E)/(t_F-t_E)$.

Moreover, since a voltage value at each measurement point depends on the initial voltage value of the secondary battery 20 and the battery temperature Tb at which the charging curve is measured, the battery temperature Tb is included in explanatory variables for the multiple regression analysis. Accordingly, the explanatory variables used for the multiple regression analysis are the battery temperature Tb, the initial voltage value $V_0$, the voltage value slope CD, and the voltage value slope EF.

The estimated full-charge capacity Q is calculated as $Q=B_1Tb+B_2V_0+B_3CD+B_4EF+e$. $B_1$ to $B_4$ are partial regression variables obtained through the multiple regression analysis, and e is a residual. Since the battery temperature Tb, the initial voltage value $V_0$, the voltage value slope CD, and the voltage value slope EF, which are explanatory variables, have different units and magnitudes in general, the multiple regression analysis is performed by using transformed data obtained by performing transformation by using an average and a standard deviation. For the multiple regression analysis, for example, 100 secondary batteries 20 are prepared, and a charging curve of each secondary battery is measured, for example, under four conditions of the battery temperature Tb that are 5° C., 15° C., 25° C., and 35° C., so that a total of 400 sets of data are used.

FIG. 5 shows an example of a summary of the model resulting from the multiple regression analysis. As shown in FIG. 5, a coefficient of multiple correlation R is 0.920, a coefficient of determination $R^2$ is 0.847, an adjusted coefficient of determination $R^2$ is 0.845, and a standard error of the estimated value is 0.449. Since the adjusted coefficient of determination $R^2$ is 0.845, the model is reliable.

FIG. 6 shows an example of the coefficients of the multiple regression analysis. In the example shown in FIG. 6, the coefficients of the multiple regression model 1 show a case where with respect to a constant value, unstandardized coefficient B=22.226, unstandardized coefficient standard error=5.616, t-value=3.957, and significance probability=0.000; and with respect to the battery temperature Tb, unstandardized coefficient B=−0.077, unstandardized coefficient standard error=0.006, standardized coefficient beta=−0.757, t-value=−13.481, and significance probability=0.000.

Moreover, the coefficients of the multiple regression model 1 show the case where with respect to $V_0$, unstandardized coefficient B=−1.525, unstandardized coefficient standard error=0.694, standardized coefficient beta=−0.067, t-value=−2.197, and significance probability=0.029; with respect to CD, unstandardized coefficient B=−639354.99, unstandardized coefficient standard error=146437.18, standardized coefficient beta=−0.376, t-value=−4.366, and significance probability=0.000; and with respect to EF, unstandardized coefficient B=−3035009.82, unstandardized coefficient standard error=169843.687, standardized coefficient beta=−0.942, t-value=−17.869, and significance probability=0.000. The t-value indicates a magnitude of contribution of each explanatory variable to the response variable.

According to the multiple regression model, since the explanatory variables T, CD, and EF are significant at a level of 1%, and the explanatory variable $V_0$ is significant at a level of 5%, the explanatory variables T, $V_0$, CD, and EF are appropriate as variables to estimate the response variable (estimated full-charge capacity Q).

Procedure of Processing Performed by Secondary Battery Degradation Determination Apparatus 10

Figure 7:
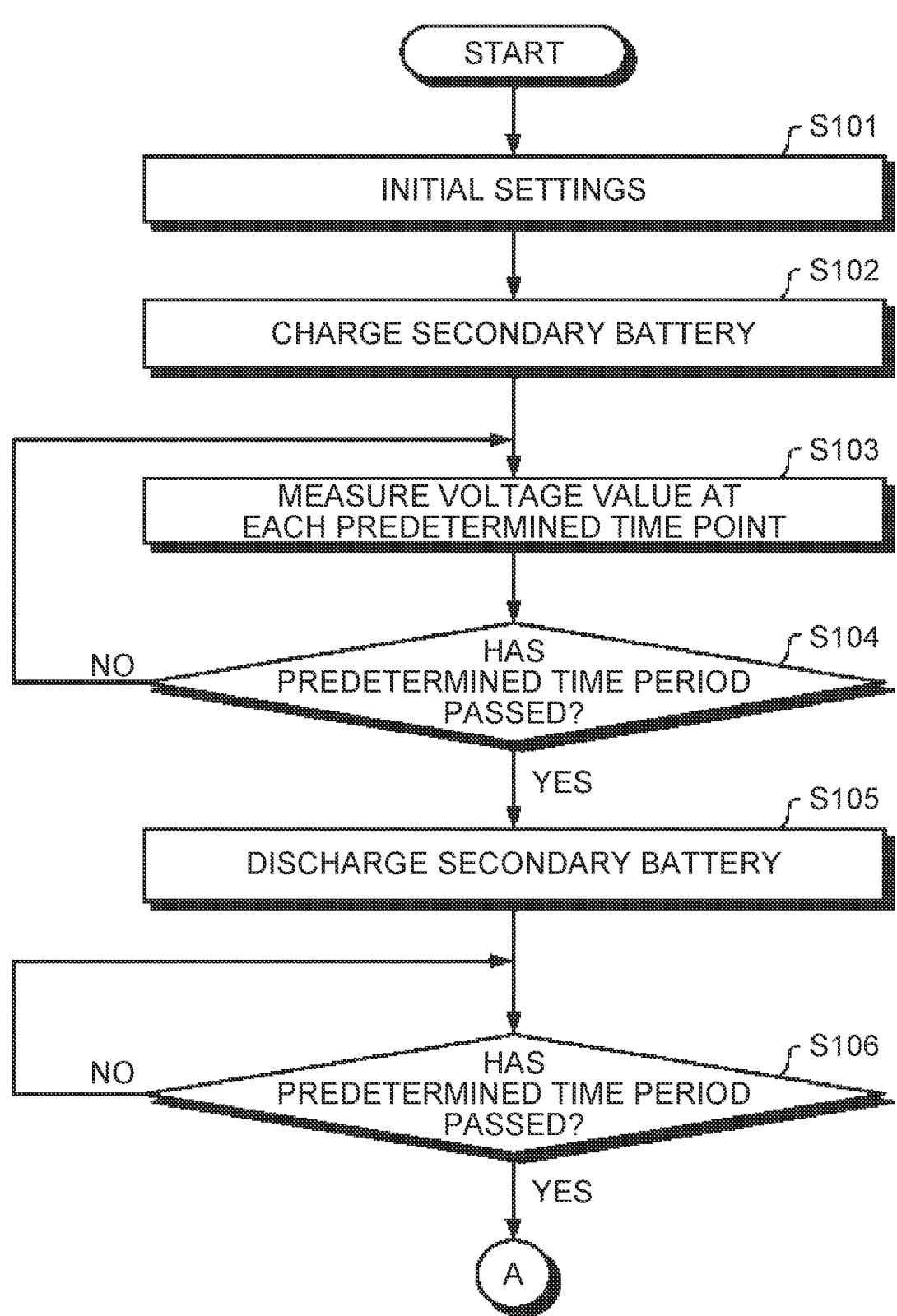
FIG. 7 is a flowchart (no. 1) showing a procedure of processing performed by the secondary battery degradation determination apparatus shown in FIG. 2.
Figure 8:
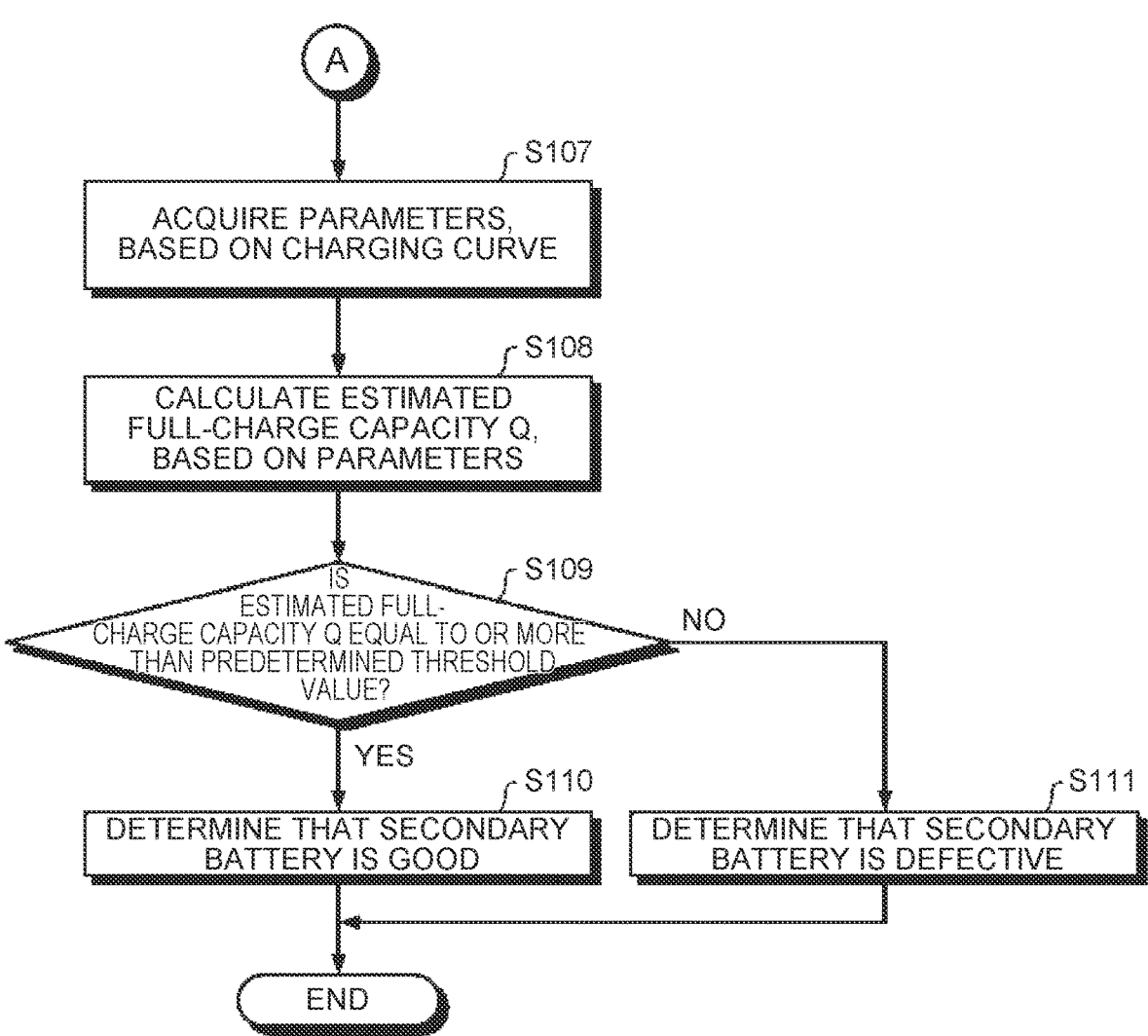
FIG. 8 is a flowchart (no. 2) showing the procedure of processing performed by the secondary battery degradation determination apparatus shown in FIG. 2.

Next, a procedure of processing performed by the secondary battery degradation determination apparatus 10 is described. FIGS. 7 and 8 are flowcharts showing the procedure of processing performed by the secondary battery degradation determination apparatus 10 shown in FIG. 2. Here, it is assumed that the multiple regression model coefficient 13c is calculated beforehand. As shown in FIG. 7, the secondary battery degradation determination apparatus 10 first performs initial settings of a current value and the like on each of the constant-current power supply 30 and the constant-current load 31, and initial settings on the constant-temperature chamber 35 (step S101).

The secondary battery degradation determination apparatus 10 controls the switch 32 such that the constant-current power supply 30 is connected to the secondary battery 20, and then the secondary battery 20 is charged with a predetermined constant current (step S102). The secondary battery degradation determination apparatus 10 measures a voltage value at each of predetermined time points by using the voltage sensor 34 (step S103). Here, the predetermined time points are, for example, 0 seconds, 0.05 seconds, 0.3 seconds, 3.3 seconds, 5 seconds, 8 seconds, and the like after start of charge.

The secondary battery degradation determination apparatus 10 determines whether or not a predetermined time period has passed (step S104), and when the predetermined time period has not passed (step S104; No), the secondary battery degradation determination apparatus 10 proceeds to step S103 and continues measurement. Here, the predetermined time period is, for example, 8 seconds that is the charging time period.

When the predetermined time period has passed (step S104; Yes), the secondary battery degradation determination apparatus 10 controls the switch 32 such that the secondary battery 20 is connected to the constant-current load 31, and causes electric charge accumulated in the secondary battery 20 to be discharged at a predetermined current (step S105). The secondary battery degradation determination apparatus 10 determines whether or not a predetermined time period has passed (step S106), and when the predetermined time period has not passed (step S106; No), the secondary battery degradation determination apparatus 10 continues discharge until the predetermined time period passes.

When the predetermined time period has passed (step S106; Yes), the secondary battery degradation determination apparatus 10 acquires the parameters such as the battery temperature Tb, the initial voltage value $V_0$, and the voltage value slopes each of which is located between any two points, based on a charging curve (step S107). Thereafter, the secondary battery degradation determination apparatus 10 calculates an estimated full-charge capacity Q of the secondary battery 20, based on the parameters on the charging curve (step S108), and determines degradation of the secondary battery 20, based on the calculated estimated full-charge capacity Q (step S109).

Based on the estimated full-charge capacity Q, when the estimated full-charge capacity Q is equal to or more than the predetermined threshold value (step S109; Yes), the secondary battery degradation determination apparatus 10 determines that the secondary battery 20 is good and reusable (step S110), and then terminates the series of processing. When the estimated full-charge capacity Q is less than the predetermined threshold value (step S109; No), the secondary battery degradation determination apparatus 10 determines that the secondary battery 20 is defective and unfit for reuse (step S111), and then terminates the series of processing.

As described above, in the first embodiment, the secondary battery degradation determination system is configured to measure charging curves and full-charge capacities $Q_0$ of a plurality of secondary batteries beforehand, to calculate coefficients of a multiple regression model by using parameters acquired from the measured charging curves and data on the full-charge capacities $Q_0$, and to construct the multiple regression model beforehand. The secondary battery degradation determination system is configured to measure a charging curve of a secondary battery 20 to be evaluated, to acquire the parameters from the charging curve, to calculate an estimated full-charge capacity Q based on the parameters by using the multiple regression model, and to determine degradation of the secondary battery 20, based on the calculated estimated full-charge capacity Q. Accordingly, degradation determination can be performed for the secondary battery 20 quickly and efficiently.

Note that the estimated full-charge capacity calculation section 14e in the first embodiment and the degradation determination section 14f in the first embodiment are implemented by the processor executing respective corresponding processes. Moreover, in the first embodiment, a case is described where the battery temperature Tb at which a charging curve is measured, the initial voltage value $V_0$, and the voltage value slopes each of which is located between any two points on the charging curve are used as explanatory variables. However, the disclosure is not limited to such a case, and can be applied to a case where explanatory variables are the initial voltage value $V_0$ and a voltage value slope between any two points on a charging curve.

In the first embodiment, a case is described where the battery temperature Tb is used as an explanatory variable. However, since many temperature measurement instruments are needed to evaluate a plurality of secondary batteries 20 at a time, the atmosphere temperature Ta of the constant-temperature chamber 35 that accommodates the plurality of secondary batteries 20 can also be used as an explanatory variable.

Modification 1

In the first embodiment, a case is described where the secondary battery degradation determination apparatus 10 uses the parameters on the charging curve (battery temperature Tb, initial voltage value $V_0$, and voltage value slopes each of which is located between any two points on the charging curve), as the explanatory variables of the multiple regression model. In a modification 1, a case is described where a voltage value at any point on the charging curve, and further a voltage value slope between any two points on a discharging curve and a voltage value at any point on the discharging curve are added to the explanatory variables.

Figure 9:
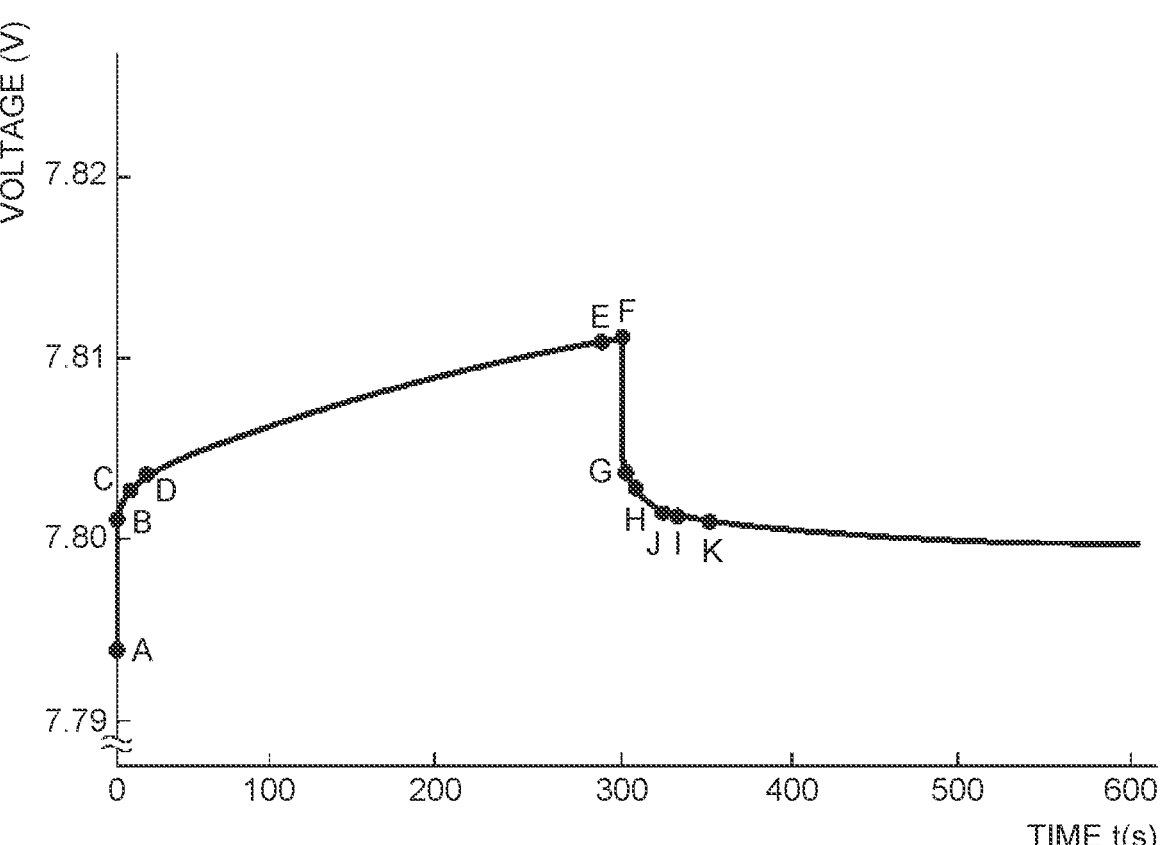
FIG. 9 is an explanatory diagram for describing an example of measurement points on a charging and discharging curve.

FIG. 9 is an explanatory diagram for describing an example of measurement points on a charging and discharging curve. As shown in FIG. 9, eleven points from point A to point K are set on a charging and discharging curve. Definitions of point A to point F are similar to those of the first embodiment. Point C is 0.31 seconds after point A. Point E is 10 seconds before point F. It is assumed that each of the charging time period and the discharging time period is 300 seconds.

Point G is an end point of the vertical dropping of the voltage starting from start of discharge. Point H is 0.01 seconds after the start of discharge, and point I is 10 seconds after point H. Point J is 10 seconds after the start of discharge, and point K is 20 seconds after point J.

A voltage value slope HI for a time period between point H and point I on the discharging curve can be calculated as $HI=(V_H-V_I)/(t_H-t_I)$. A voltage value slope JK for a time period between point J and point K can be calculated as $JK=(V_J-V_K)/(t_J-t_K)$.

FIG. 10 shows an example of explanatory variables of a multiple regression model in the modification 1. As shown in FIG. 10, the explanatory variables in the modification 1 include an initial voltage value $V_0$ at a time of starting charging, a slope CD between point C and point D, a voltage value $V_C$ at point C, a slope EF between point E and point F, a voltage value $V_E$ at point E, a slope HI between point H and point I, a voltage value $V_H$ at point H, a slope JK between point J and point K, and a voltage value $V_J$ at point J.

Figure 11:
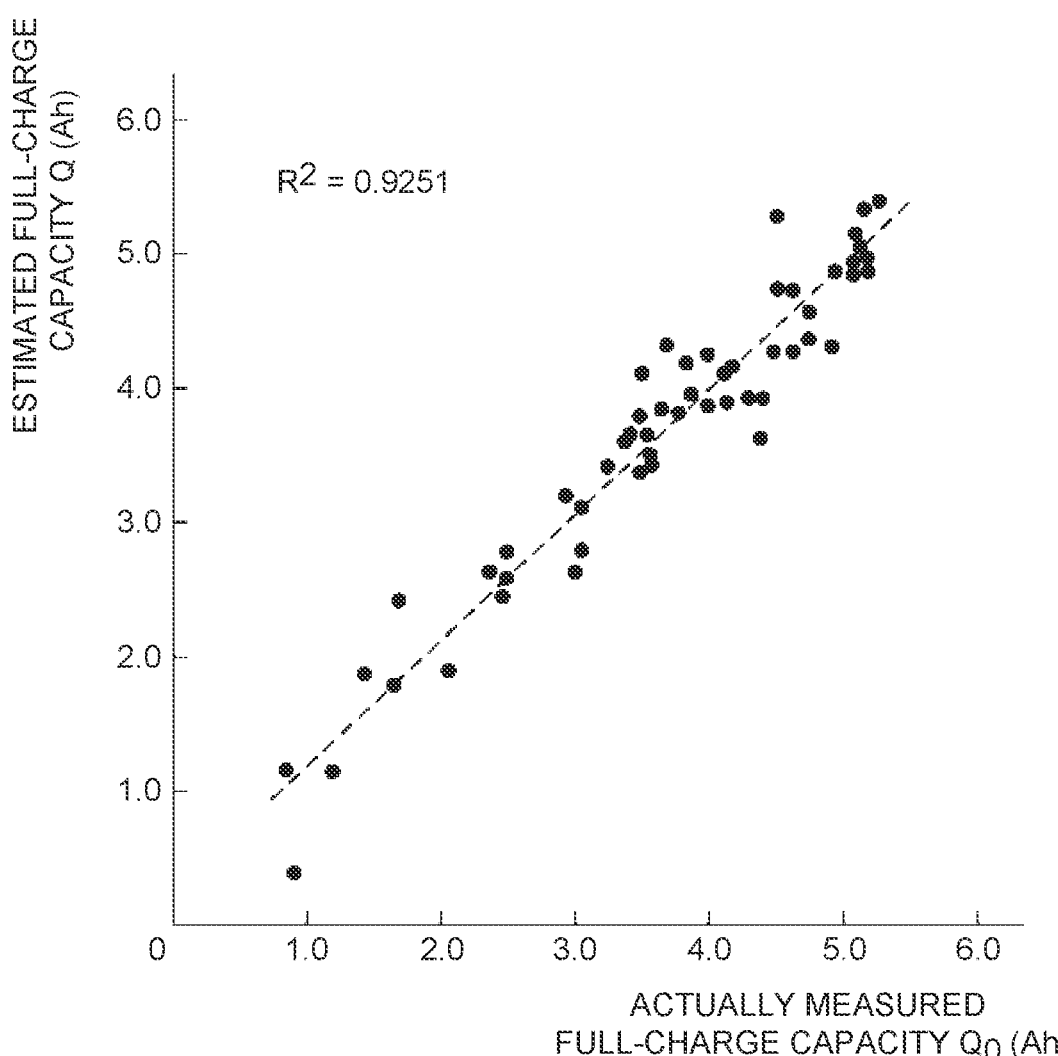
FIG. 11 shows estimated full-charge capacities estimated by the multiple regression model using the explanatory variables shown in FIG. 10.

FIG. 11 shows estimated full-charge capacities Q according to the multiple regression model using the explanatory variables shown in FIG. 10. As shown in FIG. 11, the multiple regression model using the explanatory variables shown in FIG. 10 has an adjusted coefficient of determination $R^2=0.9251$, and thus, the reliable model has been able to be created.

The modification 1 shows a case where both the voltage value slopes each of which is located between any two points on the discharging curve and the voltage values at any points on the discharging curve are added. However, the disclosure is not limited to such a case, and can also be applied to a case where any one of a voltage value slope between any two points on the discharging curve and a voltage value at any point on the discharging curve is added.

Modification 2

Next, in a modification 2, a case is described where a voltage value slope (first derivative) at a predetermined time point on a charging and discharging curve and a curvature (second derivative) of the charging and discharging curve are added to the explanatory variables. The first derivative and the second derivative cannot be obtained from discrete voltage values on the charging and discharging curve, and therefore are calculated by using a voltage formula expressed as a continuous function, because an original voltage formula can be expressed as a continuous function with respect to time by representing a graph of voltage values with respect to time as a linear combination of several principal-component vectors by using principal-component analysis, and smoothly interpolating each principal-component vector by using a polynomial. Specifically, a technique of polynomial fitting using principal-component analysis according to Japanese Patent No. 3941569 is used, and the first derivative and the second derivative are calculated by using such a polynomial.

FIG. 12 shows an example of explanatory variables of a multiple regression model in the modification 2. As shown in FIG. 12, the explanatory variables in the modification 2 include an initial voltage value $V_0$ at a time of starting charging, a voltage value $V_B$ at point B that is an end point of the vertical rising of the voltage starting from the start of charge, a voltage value $V_C$ at point C that is two seconds after the start of charge, a voltage value $V_E$ at point E that is 270 seconds after the start of charge, a first derivative C' at point C, a first derivative E' at point E, a first derivative H' at point H (26 seconds after start of discharge), a first derivative J' at point J (50 seconds after the start of discharge), a second derivative L" at point L (20 seconds after the start of charge), and a second derivative N" at point N (26 seconds after the start of charge).

Figure 13:
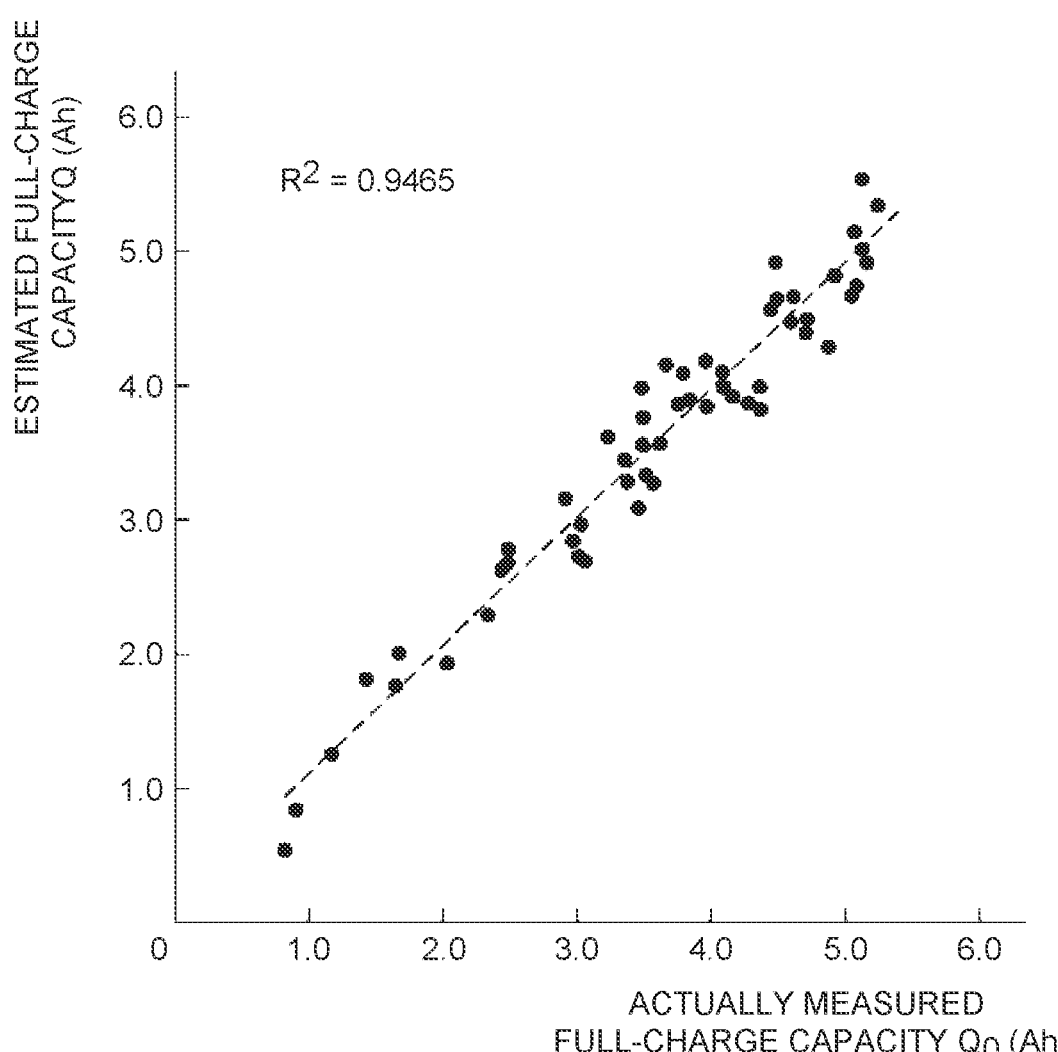
FIG. 13 shows estimated full-charge capacities estimated by the multiple regression model using the explanatory variables shown in FIG. 12.

FIG. 13 shows estimated full-charge capacities Q according to the multiple regression model using the explanatory variables shown in FIG. 12. As shown in FIG. 13, the multiple regression model using the explanatory variables shown in FIG. 12 has an adjusted coefficient of determination $R^2=0.9465$, and thus, the reliable model has been able to be created.

The modification 2 shows a case where both the first derivatives and the second derivatives at predetermined time points on the charging and discharging curve are added to the explanatory variables. However, the disclosure is not limited to such a case, and can also be applied to a case where any one of a first derivative and a second derivative at predetermined time points on the charging and discharging curve is added to the explanatory variables.

Modification 3

In the first embodiment, a case is described where the secondary battery degradation determination apparatus 10 calculates the coefficients of the multiple regression model by using the charging curves and the full-charge capacities $Q_0$ of secondary batteries that are measured beforehand. In a modification 3, a case is described where data on charging curves and full-charge capacities $Q_0$ of secondary batteries that are measured beforehand is divided into training data, validation data, and generalization performance validation data, and coefficients of a multiple regression model are calculated in a case of improving generalization performance of the multiple regression model by using the training data.

Figure 14:
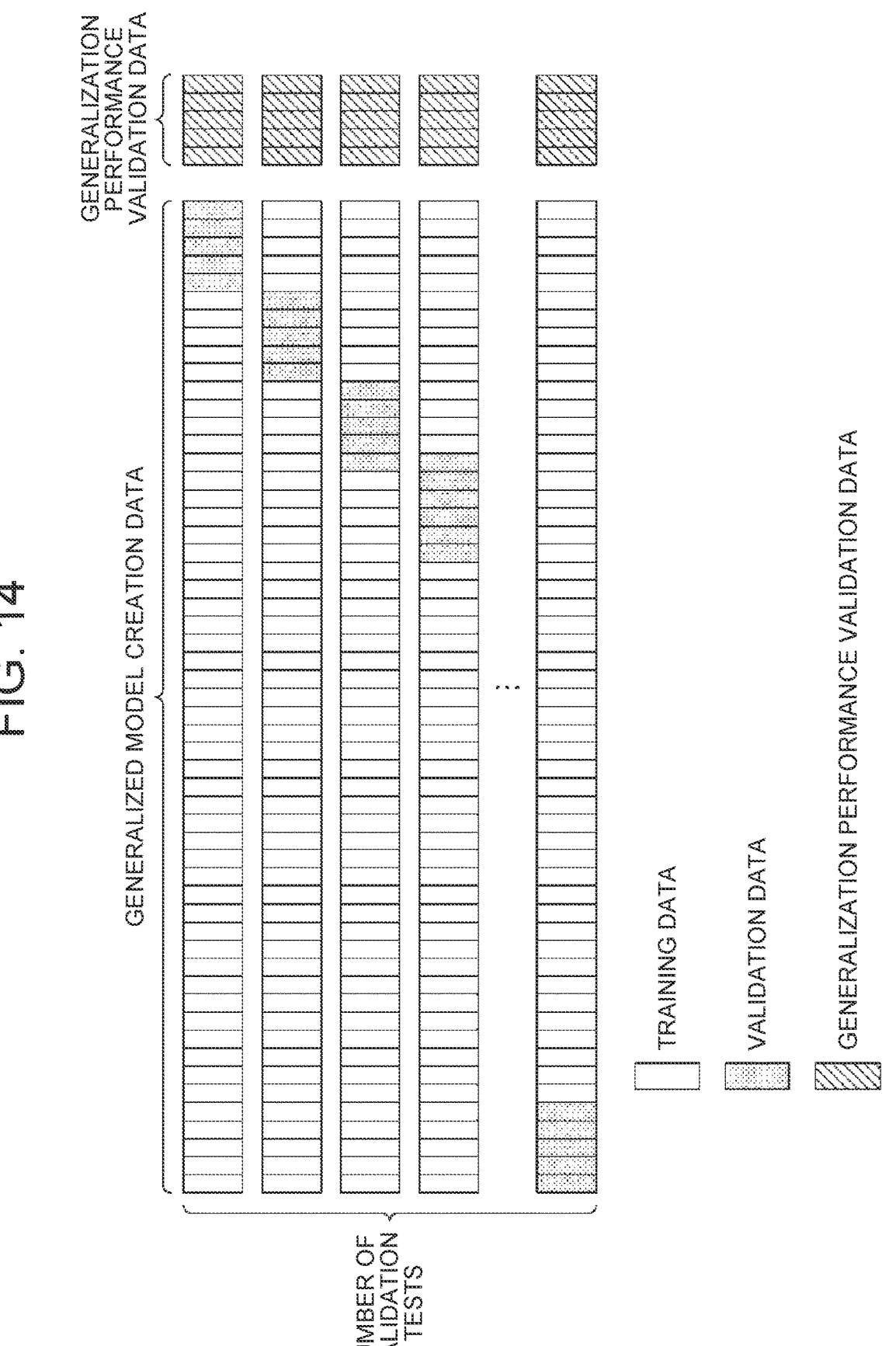
FIG. 14 is an explanatory diagram for describing creation of a generalized model in a modification 3.

FIG. 14 is an explanatory diagram for describing creation of a generalized model in the modification 3. As shown in FIG. 14, it is assumed here that $N_{ALL}=60$ where $N_{ALL}$ is all measured data on charging curves and full-charge capacities $Q_0$ of secondary batteries that are measured beforehand. To create a generalized model, the all measured data $N_{ALL}$ is divided as follows: training data $N_T=50$, validation data $N_K=5$, and generalization performance validation data $N_H=5$. Then, for a generalized model, multiple regression analysis is performed by using the training data, and coefficients of a multiple regression model are calculated.

The validation data $N_K$ is input into the multiple regression model created by using the training data $N_T$, and cross-validation is performed. Here, when a coefficient of determination $R^2$ of each created multiple regression model is greater than a predetermined value, it is determined that the created multiple regression model is useful. Note that a plurality of generalized models are created by changing combinations of the training data $N_T$ and the validation data $N_K$.

Thereafter, an average of standardized coefficients beta of the plurality of multiple regression models after cross-validation is calculated, the generalization performance validation data is input into a multiple regression model using the averaged standardized coefficient beta, and generalization performance of the multiple regression model is determined. In the determination of the generalization performance, it is determined that the created multiple regression model is useful when an adjusted coefficient of determination $R^2$ of the multiple regression model into which the generalization performance validation data is input is greater than a predetermined value.

Second Embodiment

In the first embodiment, a case is described where a multiple regression model is used to calculate an estimated full-charge capacity Q. In a second embodiment, a case is described where a trained model is used that is obtained as a result of performing supervised learning by using a multilayer neural network, and by using, as teaching data, charging curves and full-charge capacities $Q_0$ of secondary batteries that are measured beforehand.

System Configuration of Secondary Battery Degradation Determination System

Figure 15:
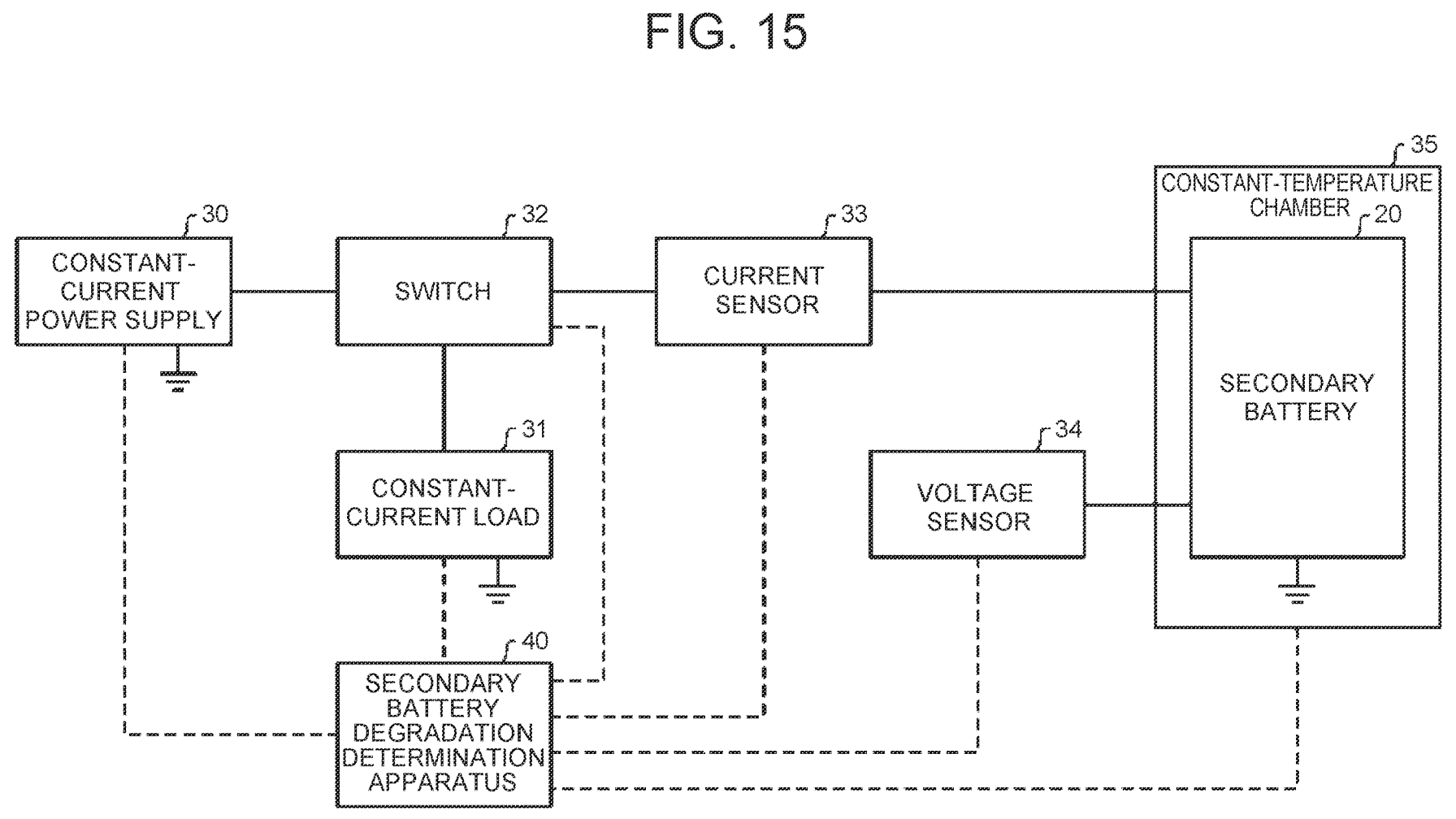

A system configuration of a secondary battery degradation determination system according to the second embodiment is described. FIG. 15 shows the system configuration of the secondary battery degradation determination system according to the second embodiment. Note that portions similar to those of the first embodiment are denoted by the same reference signs, and detailed description thereof is omitted.

As shown in FIG. 15, the secondary battery degradation determination system includes a secondary battery degradation determination apparatus 40, the constant-current power supply 30, the constant-current load 31, the switch 32, the current sensor 33, the voltage sensor 34, and the constant-temperature chamber 35. A solid line shown in the drawing represents a connection line that connects circuit elements, and a broken line shown in the drawing represents a control line.

Here, the secondary battery degradation determination apparatus 40 shown in FIG. 15 initializes settings by powering on each of the constant-current power supply 30, the constant-current load 31, and the constant-temperature chamber 35. The secondary battery degradation determination apparatus 40 controls the switch 32 such that the constant-current power supply 30 is connected to a secondary battery 20, and then the secondary battery 20 is charged.

The secondary battery degradation determination apparatus 40 measures a voltage value at a time of charging the secondary battery 20, by using the voltage sensor 34. At the time, the secondary battery degradation determination apparatus 40 measures a current value at the time of charging the secondary battery 20, by using the current sensor 33, and performs current control such that the current value is a predetermined value. Thereafter, the secondary battery degradation determination apparatus 40 controls the switch 32 such that the secondary battery 20 is connected to the constant-current load 31, to cause electric charge accumulated in the secondary battery 20 to be discharged.

Thereafter, the secondary battery degradation determination apparatus 40 calculates an estimated full-charge capacity Q by using the trained model of the multilayer neural network, based on the charging curve of the secondary battery 20. Thereafter, the secondary battery degradation determination apparatus 40 determines degradation of the secondary battery 20, based on the estimated full-charge capacity Q of the secondary battery 20.

Configuration of Secondary Battery Degradation Determination Apparatus 40

Figure 16:
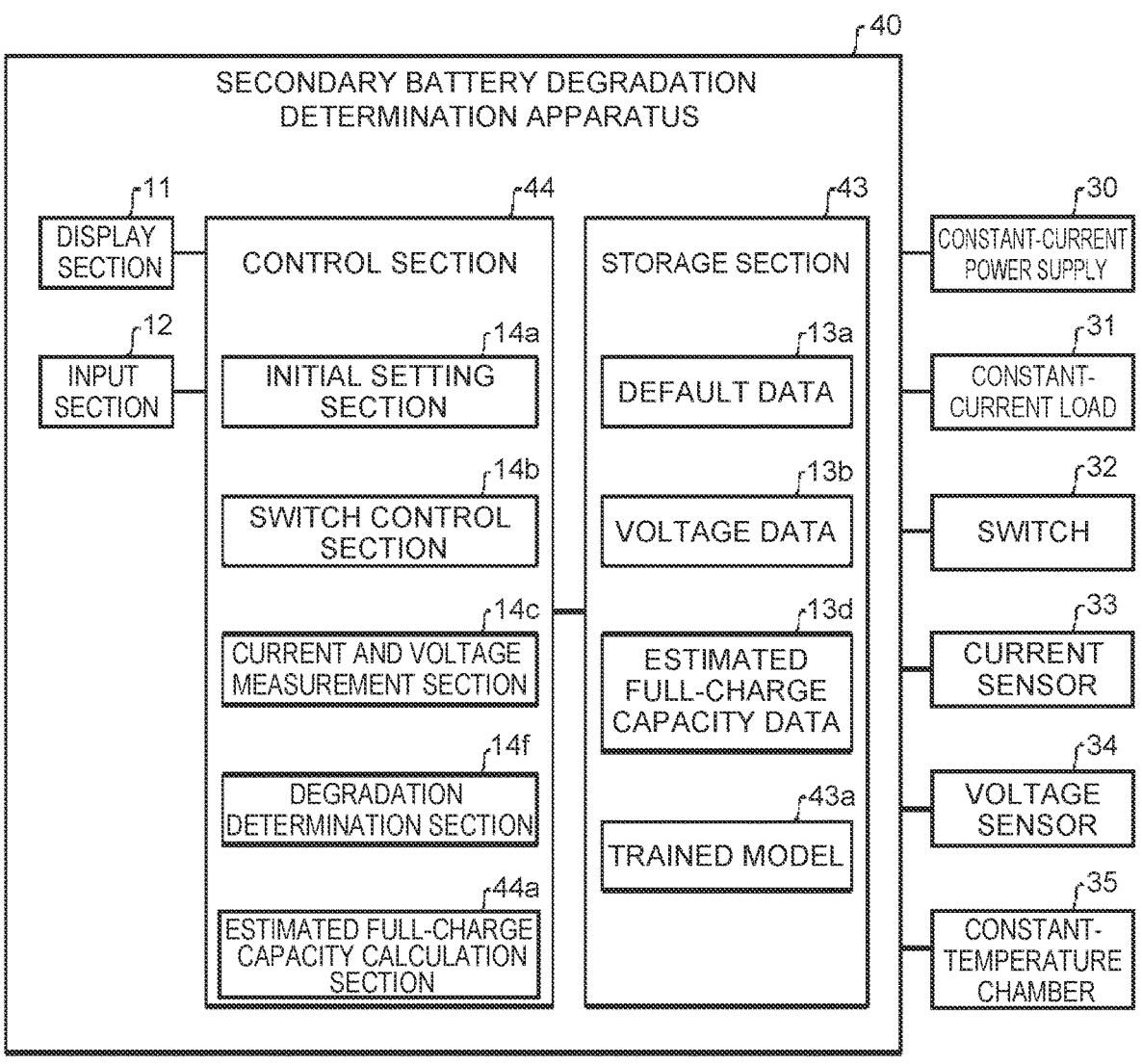
FIG. 16 is a functional block diagram for describing a configuration of a secondary battery degradation determination apparatus shown in FIG. 15.

Next, a configuration of the secondary battery degradation determination apparatus 40 is described. FIG. 16 is a functional block diagram for describing the configuration of the secondary battery degradation determination apparatus 40 shown in FIG. 15. As shown in FIG. 16, the secondary battery degradation determination apparatus 40 includes the display section 11, the input section 12, a storage section 43, and a control section 44. Moreover, the constant-current power supply 30, the constant-current load 31, the switch 32, the current sensor 33, the voltage sensor 34, and the constant-temperature chamber 35 are connected to the secondary battery degradation determination apparatus 40.

The storage section 43 is a storage device such as a hard disk device or a non-volatile memory, and stores the default data 13a, the voltage data 13b, the estimated full-charge capacity data 13d, and a trained model 43a. The trained model 43a is a trained model obtained by causing a multilayer neural network (CNN; Convolutional Neural Network) to perform learning through deep learning. The trained model 43a is a model created by performing learning processing by using a separate server, cloud computing, or the like, and by using, as teaching data, a dataset including charging curves obtained by measuring a plurality of secondary batteries, and full-charge capacities $Q_0$ corresponding to the charging curves as correct values.

Figure 17:
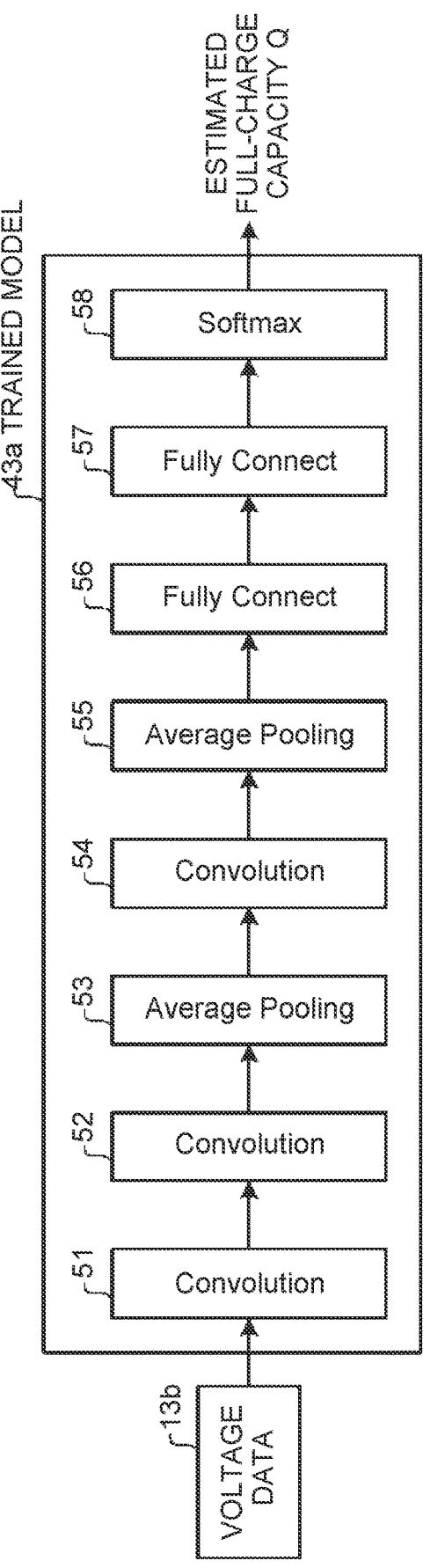
FIG. 17 is an explanatory diagram for describing an example of a layer structure of a trained model shown in FIG. 16.

Here, a layer structure of the trained model 43a is described. FIG. 17 is an explanatory diagram for describing an example of the layer structure of the trained model 43a shown in FIG. 16. As shown in FIG. 17, the trained model 43a includes a convolution layer (Convolution) 51, a convolution layer (Convolution) 52, an average pooling layer (Average Pooling) 53, a convolution layer (Convolution) 54, an average pooling layer (Average Pooling) 55, a fully connected layer (Fully Connect) 56, a fully connected layer (Fully Connect) 57, and an output layer (Softmax) 58. However, the layer structure of the CNN is not limited to such a structure.

Each of the convolution layers 51, 52, 54 creates feature maps by convolving filters in a near node in a previous layer, in order to extract local features. Each of the average pooling layers 53, 55 makes new feature maps by further reducing the feature maps output from the previous convolution layer, in order to integrate the local features. As described above, hidden layers of the CNN are formed of convolution layers and average pooling layers.

Each of the fully connected layers 56, 57 connects each feature map, into which feature portions are extracted, to one node so as to output a transformed value obtained by using a predetermined activation function. As the activation function, a well-known technique, rectified linear unit (ReLU), or the like can be used. The output layer 58 converts the outputs (feature variables) from the fully connected layer 57 into probabilities by using a softmax function, and outputs the probabilities of individual inputs being correctly classified. Note that a dropout layer can be added in order to avoid overfitting. Since a basic structure of the CNN is a publicly known technique, a detailed description thereof is omitted here.

Referring back to FIG. 16, the control section 44 is a control section that controls the entire secondary battery degradation determination apparatus 40, and includes the initial setting section 14a, the switch control section 14b, the current and voltage measurement section 14c, the degradation determination section 14f, and an estimated full-charge capacity calculation section 44a. In actuality, a CPU is caused to perform respective processes corresponding to the initial setting section 14a, the switch control section 14b, the current and voltage measurement section 14c, the degradation determination section 14f, and the estimated full-charge capacity calculation section 44a, by loading the respective programs thereof into the CPU and causing the CPU to execute the respective programs. In other words, the control section 44 includes a processor. That is to say, the secondary battery degradation determination apparatus 40 includes the processor.

The estimated full-charge capacity calculation section 44a calculates the estimated full-charge capacity Q by using the trained model 43a, based on the measured charging curve of the secondary battery 20.

As described above, in the second embodiment, the secondary battery degradation determination system is configured to measure charging curves and full-charge capacities $Q_0$ of a plurality of secondary batteries beforehand, to create a trained model using a multilayer neural network by using data on the measured charging curves and full-charge capacities $Q_0$, to measure a charging curve of the secondary battery 20 to be evaluated, to calculate an estimated full-charge capacity Q by using the trained model, based on the charging curve, and to determine degradation of the secondary battery 20, based on the calculated estimated full-charge capacity Q. Accordingly, degradation determination can be performed for the secondary battery 20 quickly and efficiently.

In the second embodiment, a case is described where the trained model is created through deep learning. However, the disclosure is not limited to such a case, and if a decision tree is constructed by using parameters on a current charging and discharging curve, a trained model can also be created through machine learning using gradient boosting of decision trees. For example, XGBoost, LightGBM, or the like can also be applied.

In the first embodiment and the second embodiment, the multiple regression model that obtains the estimated full-charge capacity Q uses the parameters on the charging curve of the secondary battery as explanatory variables. However, the disclosure is not limited to such a case, and a parameter on a charging and discharging curve including at least a voltage value slope between any two points on a charging curve may be selected as an explanatory variable. The multiple regression model may use voltage values at measurement points on a charging and discharging curve in a form of an explanatory function.

In the first embodiment and the second embodiment, the current applied to measure a charging and discharging curve is a constant current of 1 A. However, the disclosure is not limited to such a case, and another constant current value such as 2.5 A may be used.

In the first embodiment and the second embodiment, a case is described where the voltage values on the charging and discharging curve are used as parameters. However, the disclosure can also be applied to a case where a state of charge is used.

Each configuration illustrated in each of the embodiments is a functional and schematic configuration, and a configuration does not necessarily need to be physically made as shown in the drawings. In other words, forms of distribution and integration of apparatuses and devices are not limited to the forms illustrated, and a configuration can be made by distributing or integrating all of or parts of apparatuses and devices functionally or physically in any units, depending on various loads, usage conditions, and the like.

The secondary battery degradation determination apparatus and the secondary battery degradation determination method according to the disclosure are suitable when degradation determination is performed for a secondary battery quickly and efficiently.

What is claimed is:

1. A secondary battery degradation determination apparatus configured to perform degradation determination for a secondary battery as a determination target, the secondary battery degradation determination apparatus comprising a processor configured to:

control a switch such that a constant-current power supply is connected to the secondary battery and charges the secondary battery with a constant current;

measure a voltage value of the secondary battery at a first point in time on a charging curve that indicates a charging characteristic of the secondary battery, when a first predetermined time period has passed from a charging start time of the secondary battery on the charging curve;

measure a voltage value of the secondary battery at a second point in time on the charging curve, when a second predetermined time period has passed from the first point in time;

determine a first voltage value slope between the first point in time and the second point in time;

measure a voltage value of the secondary battery at a third point in time and a fourth point in time on the charging curve, the third point in time being later than the second point in time;

determine a second voltage value slope between the third point in time and the fourth point in time;

calculate an estimated electric capacity of the secondary battery, based on at least (i) the first voltage value slope, (ii) the voltage value at the first point in time, (iii) the second voltage value slope, and (iv) the voltage value at the third point in time; and perform the degradation determination for the secondary battery, based on the estimated electric capacity that is calculated.

2. The secondary battery degradation determination apparatus according to claim 1, wherein the processor is configured to calculate the estimated electric capacity of the secondary battery by using a multiple regression model in which the estimated electric capacity is a response variable, and explanatory variables include (i) the first voltage value slope between the first point in time and the second point in time on the charging curve of the secondary battery and (ii) the voltage value at the first point in time on the charging curve.

3. The secondary battery degradation determination apparatus according to claim 2, wherein the processor is configured to calculate the estimated electric capacity of the secondary battery by using the multiple regression model in which the explanatory variables include a voltage value at a time of starting charging of the secondary battery and/or a temperature at a time of measuring the charging curve, in addition to the first voltage value slope between the first point in time and the second point in time on the charging curve and the voltage value at the first point in time on the charging curve.

4. The secondary battery degradation determination apparatus according to claim 3, wherein the processor is configured to calculate a coefficient of the multiple regression model, based on charging curves and electric capacities of a plurality of secondary batteries, and calculate the estimated electric capacity of the secondary battery by using the multiple regression model to which the calculated coefficient is applied.

5. The secondary battery degradation determination apparatus according to claim 1, wherein the processor is configured to determine that the secondary battery is good and reusable when the estimated electric capacity is equal to or more than a predetermined threshold value, and to determine that the secondary battery is defective and unfit for reuse when the estimated electric capacity is less than the predetermined threshold value.

6. The secondary battery degradation determination apparatus according to claim 1, wherein a time period from the third point in time to the fourth point in time is equal to the predetermined second time period.

7. The secondary battery degradation determination apparatus according to claim 1, wherein:

the first voltage value slope=$(V_D-V_C)/(t_D-t_C)$, where $V_C$ is the voltage value at the first point in time, $V_D$ is the voltage value at the second point in time, $t_C$ is the first point in time, and $t_D$ is the second point in time; and the second voltage value slope=$(V_F-V_E)/(t_F-t_E)$, where $V_E$ is the voltage value at the third point in time, $V_F$ is the voltage value at the fourth point in time, $t_E$ is the third point in time, and tr is the fourth point in time.

8. The secondary battery degradation determination apparatus according to claim 1, wherein the processor is further configured to:

measure a voltage value of the secondary battery at a fifth point in time on the charging curve after a predetermined third time has elapsed from the fourth point in time;

measure a voltage value of the secondary battery at a sixth point in time on the charging curve after a predetermined fourth time has elapsed from the fifth point in time;

determine a third voltage value slope between the fifth point in time and the sixth point in time;

measure a voltage value of the secondary battery at a seventh point in time on the charging curve after a predetermined fifth time has elapsed from the fourth point in time;

measure a voltage value of the secondary battery at an eighth point in time on the charging curve after a predetermined sixth time has elapsed from the seventh point in time; and determine a fourth voltage value slope between the seventh point in time and the eighth point in time;

wherein the calculating the estimated electric capacity of the secondary battery is further based on (v) the third voltage value slope, (vi) the voltage value at the fifth point in time, (vii) the fourth voltage value slope, and (viii) the voltage value at the seventh point in time.

9. A secondary battery degradation determination method for a secondary battery degradation determination apparatus configured to perform degradation determination for a secondary battery as a determination target, the secondary battery degradation determination method comprising:

controlling a switch such that a constant-current power supply is connected to the secondary battery and charges the secondary battery with a constant current;

measuring a voltage value of the secondary battery at a first point in time on a charging curve that indicates a charging characteristic of the secondary battery, when a first predetermined time period has passed from a charging start time of the secondary battery on the charging curve;

measuring a voltage value of the secondary battery at a second point in time on the charging curve, when a second predetermined time period has passed from the first point in time;

determining a first voltage value slope between the first point in time and the second point in time;

measuring a voltage value of the secondary battery at a third point in time and a fourth point in time on the charging curve, the third point in time being later than the second point in time;

determining a second voltage value slope between the third point in time and the fourth point in time;

calculating an estimated electric capacity of the secondary battery, based on at least (i) the first voltage value slope, (ii) the voltage value at the first point in time, (iii) the second voltage value slope, and (iv) the voltage value at the third point in time; and performing the degradation determination for the secondary battery, based on the estimated electric capacity that is calculated.

10. The secondary battery degradation determination method according to claim 9, wherein a time period from the third point in time to the fourth point in time is equal to the predetermined second time period.

11. The secondary battery degradation determination method according to claim 9, wherein:

the first voltage value slope=$(V_D-V_C)/(t_D-t_C)$, where $V_C$ is the voltage value at the first point in time, $V_D$ is the voltage value at the second point in time, $t_C$ is the first point in time, and $t_D$ is the second point in time; and the second voltage value slope=$(V_F-V_E)/(t_F-t_E)$, where $V_E$ is the voltage value at the third point in time, $V_F$ is the voltage value at the fourth point in time, $t_E$ is the third point in time, and tr is the fourth point in time.

12. The secondary battery degradation determination method according to claim 9, further comprising:

measuring a voltage value of the secondary battery at a fifth point in time on the charging curve after a predetermined third time has elapsed from the fourth point in time;

measuring a voltage value of the secondary battery at a sixth point in time on the charging curve after a predetermined fourth time has elapsed from the fifth point in time;

determining a third voltage value slope between the fifth point in time and the sixth point in time;

measuring a voltage value of the secondary battery at a seventh point in time on the charging curve after a predetermined fifth time has elapsed from the fourth point in time;

measuring a voltage value of the secondary battery at an eighth point in time on the charging curve after a predetermined sixth time has elapsed from the seventh point in time; and determining a fourth voltage value slope between the seventh point in time and the eighth point in time;

wherein the calculating the estimated electric capacity of the secondary battery is further based on (v) the third voltage value slope, (vi) the voltage value at the fifth point in time, (vii) the fourth voltage value slope, and (viii) the voltage value at the seventh point in time.

* * * * *